(12) United States Patent
Kukimoto et al.

(10) Patent No.: US 7,452,797 B2
(45) Date of Patent: Nov. 18, 2008

(54) SOLDER DEPOSITION METHOD AND SOLDER BUMP FORMING METHOD

(75) Inventors: Youichi Kukimoto, Kakogawa (JP); Hitoshi Sakurai, Kakogawa (JP); Seishi Kumamoto, Kakogawa (JP); Kenshu Oyama, Kakogawa (JP)

(73) Assignee: Harima Chemicals, Inc., Hyogo (JP)

( * ) Notice: Subject to any disclaimer, the term of this patent is extended or adjusted under 35 U.S.C. 154(b) by 0 days.

(21) Appl. No.: 10/765,931

(22) Filed: Jan. 29, 2004

(65) Prior Publication Data

US 2004/0209451 A1    Oct. 21, 2004

(30) Foreign Application Priority Data

Apr. 15, 2003    (JP) ............................. 2003-110125

(51) Int. Cl.
*H01L 21/44*    (2006.01)

(52) U.S. Cl. ..................................... 438/612; 438/613

(58) Field of Classification Search ......... 438/612–613, 438/614, 652, 686; 257/734, 741, 772
See application file for complete search history.

(56) References Cited

U.S. PATENT DOCUMENTS

| 5,024,372 A | * | 6/1991 | Altman et al. ......... 228/180.22 |
| 5,056,215 A | * | 10/1991 | Blanton ....................... 29/840 |
| 5,738,269 A | * | 4/1998 | Masterton ................ 228/248.1 |
| 6,408,511 B1 | * | 6/2002 | Branchevsky ................ 29/843 |
| 6,461,953 B1 | | 10/2002 | Sakuyama et al. |
| 6,524,943 B1 | * | 2/2003 | Sakuyama .................. 438/613 |
| 6,586,322 B1 | * | 7/2003 | Chiu et al. .................. 438/612 |
| 6,709,898 B1 | * | 3/2004 | Ma et al. .................... 438/122 |
| 6,784,087 B2 | * | 8/2004 | Lee et al. .................... 438/612 |
| 6,881,278 B2 | * | 4/2005 | Amita et al. ................... 148/23 |
| 6,921,860 B2 | * | 7/2005 | Peterson et al. ............ 174/52.2 |
| 6,923,875 B2 | * | 8/2005 | Ikeda et al. .................... 148/24 |
| 7,119,000 B2 | * | 10/2006 | Shimizu et al. ............. 438/597 |
| 7,291,517 B2 | * | 11/2007 | Sakurai et al. .............. 438/106 |
| 2002/0046627 A1 | * | 4/2002 | Amita et al. ................... 75/252 |
| 2004/0011855 A1 | * | 1/2004 | Nakamura et al. .......... 228/175 |

FOREIGN PATENT DOCUMENTS

JP    05-235003 A    9/1993

(Continued)

OTHER PUBLICATIONS

Patent Abstract of Japan "Method for forming bump" Publication No. 2002-334895, Sakuyama Seiki (Nov. 22, 2002), translation.*

(Continued)

*Primary Examiner*—W. David Coleman
*Assistant Examiner*—Khiem D Nguyen
(74) *Attorney, Agent, or Firm*—Sughrue Mion, PLLC

(57) ABSTRACT

The present invention provides a solder deposition method that includes the step of forming a dam around an electrode on a substrate, the step of applying a solder precipitating composition to the substrate, and the step of depositing solder on the surface of the electrode while heating the solder precipitating composition applied. This solder deposition method is suitable for forming large bumps at fine pitches. In particular, it is capable of depositing solder in a desired height precisely and easily, and yet preventing occurrence of voids.

15 Claims, 2 Drawing Sheets

FOREIGN PATENT DOCUMENTS

| | | | |
|---|---|---|---|
| JP | 06-183165 A | 7/1994 |
| JP | 09-148333 A | 6/1997 |
| JP | 09-181429 A | 7/1997 |
| JP | 10-163211 A | 6/1998 |
| JP | 10-242649 A | 9/1998 |
| JP | 11-191673 A | 7/1999 |
| JP | 2000-049182 A | 2/2000 |
| JP | 1-157796 | 6/2001 |
| JP | 2002-141367 A | 5/2002 |
| JP | 2002-334895 | * 11/2002 |
| JP | 2002-353272 A | 12/2002 |
| WO | WO 00/10369 A1 | 2/2000 |

OTHER PUBLICATIONS

Patent Abstract of Japan "Method for forming bump" Publication No. 2002-334895, Sakuyama Seiki (Nov. 22, 2002), English translation.*
Office Action from Japanese Patent Office dated May 2, 2006.
Seiki Sakuyama, "Solder Bumping Technology for Wafer-scale Packaging", 7th Symposium on "Microjoining and Assembly Technology in Electronics", Feb. 1-2, 2001, pp. 285-290.

* cited by examiner

SOLDER DEPOSITION METHOD AND SOLDER BUMP FORMING METHOD

Priority is claimed to Japanese Patent Application No. 2003-110125, filed on Apr. 15, 2003, the disclosure of which is incorporated by reference in its entirety.

BACKGROUND OF THE INVENTION

1. Field of the Invention

The present invention relates to a solder deposition method and a solder bump forming method that are suitable for surface mount of electronic parts on electronic circuit substrates.

2. Description of Related Art

In recent years, to meet the demand for smaller and lighter-weight of electronic equipment, multi-pin and narrow-pitch of electronic parts is developed, and fine pitch of conductor patterns is also advanced in which a large number of conductors are formed in a narrow range at very small intervals. Therefore, in place of conventional wire bonding, mounting method using solder bumps is widely employed to connect electronic parts to an electronic circuit substrate. Via-on-pad structure where via holes were connected with pads in a substrate for the sake of wiring design is also widely employed.

For solder bumps at fine pitch, it is required to keep the height of bumps constant with sufficient precision in order to connect securely electronic parts and obtain high reliability. Further, as shown in FIG. 2, for example, in a via-on-pad wherein a via hole 11 is provided in a substrate 10, the joint strength of electronic parts becomes low because of a void 13 within a solder bump 12 formed on an electrode 14. It is therefore also required that no void 13 exists within the solder bump 12.

Instead of conventional plating and deposition, metal mask method and resin mask method, each using a solder paste that is a mixture of solder powder and flux, are widely employed as a method of forming solder bumps.

However, Japanese Patent Unexamined Publication No. 2002-334895 describes that metal mask method has poor precision in bump height, and that resin mask method suffers from the drawback that the electronic part assembly is obstructed by a part of the resin film residue on the substrate surface (see columns [0005] to [0009] in this publication).

In Publication No. 2002-334895, to eliminate the drawback of resin mask method, the curing of a resin film is suppressed so that the resin film is readily removed from the substrate surface. In accordance with the conventional solder bump forming method using a solder paste, however, a void is apt to occur within bumps, and therefore joint strength lowers, thus failing to obtain high reliability. Particularly when using a via-on-pad structured substrate, or when using a lead-free solder paste containing no lead in solder material, a void is apt to occur.

On the other hand, as other method of forming fine pitch solder bumps, there is known a method wherein a solder precipitating composition containing tin powder and lead salt of organic acid is applied on all over a substrate surface including electrodes, and then heated to separate metal lead, thereby depositing solder alloy on the surface of the electrode (Japanese Patent Unexamined Publication No. 1-157796). That is, when tin powder and lead salt of organic acid are mixed and heated, lead atoms of the lead salt of organic acid are replaced by tin atoms and then separated, which thereafter diffuse into excess tin metal powder and form Sn—Pb alloy. Recently, the development of lead-free solder precipitating compositions is also advanced from the demand for lead-free.

The use of such solder precipitating composition enables to form bumps precisely on electrodes of fine pitch substrates, and also prevent occurrence of voids as in the case of using a solder paste. With a method of forming bumps using a solder precipitating composition, it is however difficult to form bumps having a desired height in a single deposition operation. This method therefore often requires at least two deposition operations.

SUMMARY OF THE INVENTION

Accordingly, it is an advantage of the present invention to provide a solder deposition method that can deposit precisely and easily solder having a desired height (film thickness), and a solder bump forming method using the solder deposition method.

It is other advantage of the present invention to provide a solder deposition method that can prevent occurrence of voids, and a solder bump forming method using this solder deposition method.

The present inventors have accomplished the present invention from a new finding that when dams are formed around electrodes on a substrate and thereafter solder is deposited on the surface of the electrode, the occurrence of voids is avoidable and yet solder having a desired height (film thickness) can be deposited precisely in a single deposition operation. The solder deposition method of the present invention is especially suitable for forming large solder bumps at fine pitches.

Specifically, the solder deposition method of the present invention includes the step of forming a dam around an electrode on a substrate, the step of applying a solder precipitating composition on the substrate, and the step of depositing solder on the electrode while heating the solder precipitating composition so applied. This enables to prevent occurrence of voids, and also deposit precisely solder (e.g., solder bump) having a desired height in a single deposition operation. This improves joint strength when electronic parts are connected to a substrate by using solder, thus leading to high joint reliability.

The dam can be formed by such as, but not limited to, the step of forming a resin film on a substrate surface, and the step of providing an opening part in the resin film so that a dam is formed around an electrode on the substrate.

In accordance with the present invention, to simplify the steps, the above-mentioned dam is preferably not removed after depositing solder. The above-mentioned substrate is preferably a via-on-pad structured substrate.

The bump forming method of the present invention includes the step of forming a dam around an electrode on a substrate, the step of applying a solder precipitating composition on the substrate, and the step of forming a solder bump depositing solder on the surface of the electrode while heating the applied solder precipitating composition.

DESCRIPTION OF PREFERRED EMBODIMENTS

Figure 1:
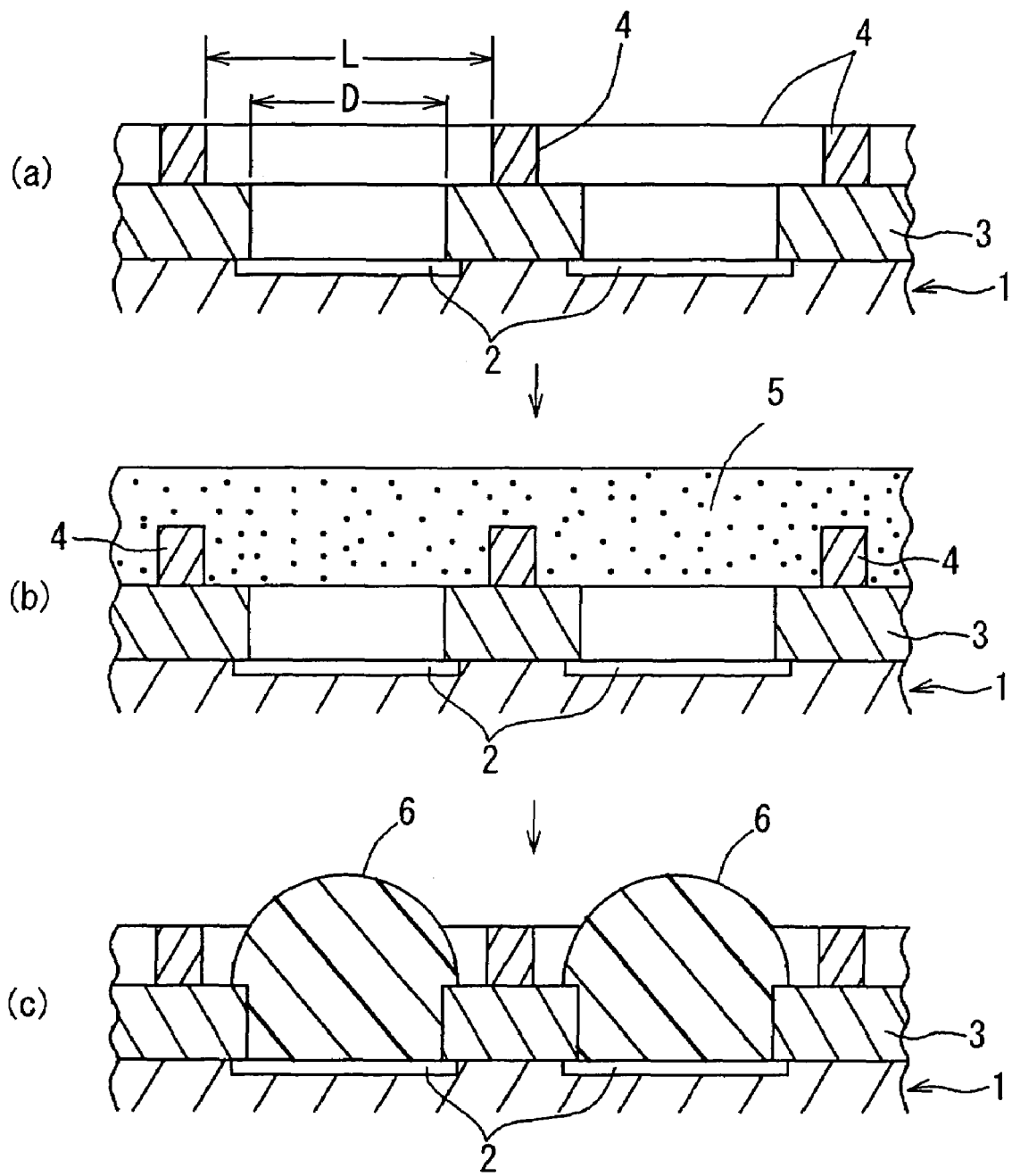
FIG. 1(a) to FIG. 1(c) are diagrams showing the steps in a method of the present invention.
Figure 2:
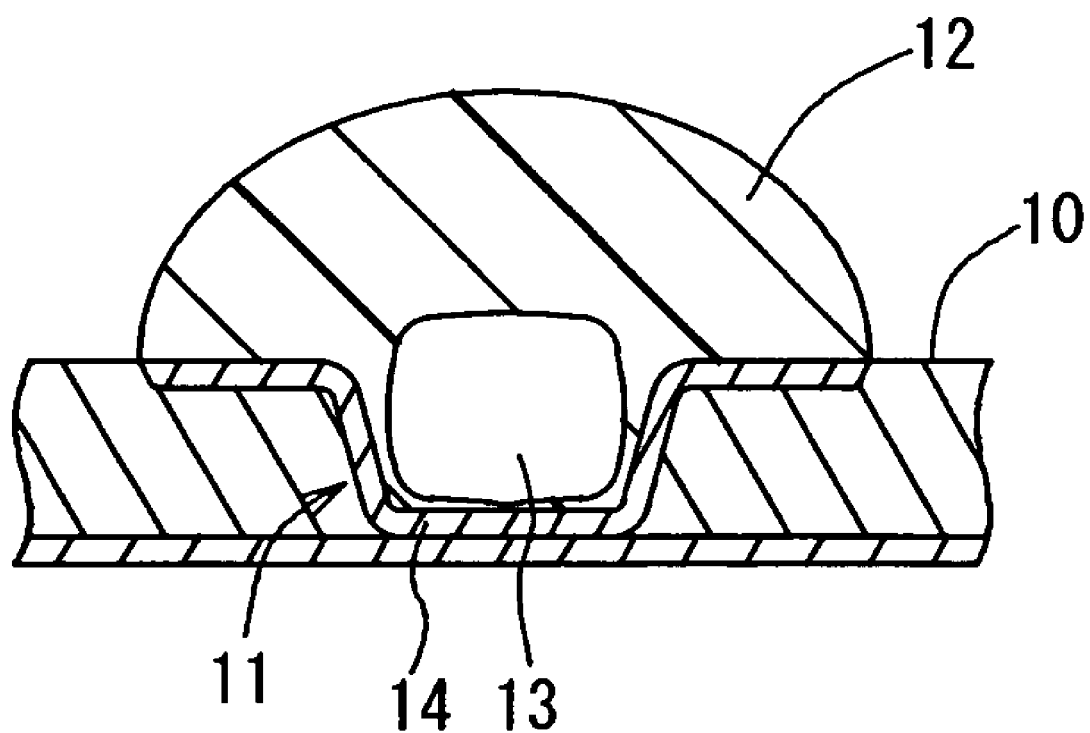
FIG. 2 is a sectional view showing a conventional example in which a solder bump is formed on a substrate (via-on-pad structured substrate) having a via hole.

Following is a detailed description of preferred embodiments of the present invention. FIGS. 1(a) to 1(c) illustrate a method of forming bumps according to one preferred embodiment of the present invention. Referring now to FIG. 1(a), a substrate 1 has in its surface electrodes 2, and dams 4 are formed so as to surround the electrodes 2 on the surface of the substrate 1 covered with a solder resist film 3 that is provided with an opening part disposed in the electrodes 2. Referring to FIG. 1(b), a solder precipitating composition 5 is applied to the surface of the substrate 1 and then heated, and thereafter solder is deposited on the surface of the electrodes 2. This gives solder bumps 6, as shown in FIG. 1(c). A plurality of electrodes 2 are disposed on the surface of the substrate 1 at predetermined pitches. Epoxy resin, acryl resin, and polyimide resin may be used as the solder resist film 3. It is however preferred to use epoxy resin.

The dams 4 can be formed by such as film-like photoresist and liquid photoresist. When using film-like photoresist, this is stuck by pressure to the substrate surface. When using liquid photoresist, this is applied to the substrate surface by application means such as spin coater, and then cured. Subsequently, exposure process and development (etching) process via a predetermined photomask (not shown) are performed to obtain the dams 4. Examples of etching processing liquid are $Cu_2Cl_2$ aqueous solution, $CuCl_2$ aqueous solution, and $FeCl_3$ aqueous solution.

It suffices that the dams 4 are provided vertically so as to surround the electrodes 2 and are wall-like ones mutually partitioning into the electrodes 2. Internal diameter L of the dam 4 (corresponding to the length of one side in the case of quadrangle) is about 1 to 3 times, preferably 1.2 to 2 times, greater than diameter D of the exposed electrode 2.

The thickness of the dam 4 (i.e., the thickness of the resist resin film) is not particularly limited, and it may be greater or smaller than the height of solder bump 6 to be formed. Concretely, the height of the solder bump 6 is 0.05 to 3 times, preferably 0.1 to 1.5 times, greater than the total thickness of the thickness of the dam 4 and the thickness of the solder resist film 3. The thickness of the dam 4 is usually about 10 to 300 μm, preferably about 50 to 150 μm.

After forming the solder bumps 6, the dams 4 may be removed or left as they are. However, when the height of the dams 4 is almost same as that of the bumps 6, or greater than that, the dams 4 are preferably removed because they might interfere with solder connection. The dams 4 can be removed by alkaline treatment or the like, which uses an alkaline aqueous solution such as sodium hydroxide and potassium hydroxide, organic amine aqueous solution, or organic solvent solution.

From the viewpoint of simplifying the steps, it is however preferred not to remove the dams 4. According to the present invention, the step of removing the dams 4 is not necessarily required because the height of solder can be made sufficiently high by adjusting the height of dam of resist and the amount of metal of material.

As the solder precipitating composition 5, there may be used, for example, (1) a solder precipitating composition that contains tin powder and salt of metal such as lead, copper and silver, or alternatively (2) a solder precipitating composition containing tin powder and a complex of at least one selected from silver ions and copper ions, and at least one selected from aryl phosphines, alkyl phosphines and azoles. Alternatively, a mixture of the metal salt in the above (1) and the complex in the above (2) may be used. In the present invention, it is especially preferred to use a lead-free solder precipitating composition that contains no lead.

In the present invention, it should be interpreted that the term "tin powder" includes, for example, tin-silver alloy powder containing silver, and tin-copper alloy powder containing copper, as well as metallic tin powder.

Examples of salt of metal may include salts of organic carboxylic acid or organic sulfonic acid. As organic carboxylic acid, for example, monocarboxylic acid or dicarboxylic acid having 1 to 40 carbon atoms may be used. Examples of organic carboxylic acid may include lower fatty acid such as formic acid, acetic acid, and propionic acid; fatty acid obtained from oils and fats of animal and plant, such as capronic acid, caprylic acid, lauric acid, myristic acid, palmitic acid, stearic acid, oleic acid, and linolic acid; various synthetic acids which are obtained from organic-synthesis reactions, such as 2,2-dimethylpentanoic acid, 2-ethylhexanoic acid, iso-nonanoic acid, 2,2-dimethyloctanoic acid, and n-undecanoic acid; resin acids, such as pimaric acid, abietic acid, dehydroabietic acid, and dihydroabietic acid; monocarboxylic acid such as naphthenic acid obtained from petroleum; dicarboxylic acid such as dimer acid which is obtained from tall oil fatty acid or soybean fatty acid by synthetic reaction, polymerized rosin to which dimerization of rosin is carried out. Two or more sorts of these compounds may be used.

Examples of organic sulfonic acid may include methanesulfonic acid, 2-hydroxyethanesulfonic acid, 2-hydroxypropane-1-sulfonic acid, trichloromethanesulfonic acid, trifluoromethanesulfonic acid, benzenesulfonic acid, toluenesulfonic acid, phenolsulfonic acid, cresolsulfonic acid, anisolesulfonic acid and naphthalenesulfonic acid. Two or more sorts of these compounds may be used.

Examples of the complex of silver or copper mentioned above may include a complex of at least one selected from silver ions and copper ions and at least one selected from aryl phosphines, alkyl phosphines and azoles.

Examples of phosphines may include compounds represented by the following general formula (1):

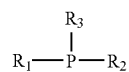

wherein $R_1$, $R_2$ and $R_3$ each represents a substituted or non-substituted aryl group, or a substituted or non-substituted chain or cyclic alkyl group having 1 to 8 carbon atoms; hydrogen of the aryl group may be substituted with an alkyl having 1 to 8 carbon atoms, an alkoxy group having 1 to 8 carbon atoms, a hydroxyl group, an amino group or a halogen atom at any position; hydrogen of the alkyl group may be substituted with an alkoxy group having 1 to 8 carbon atoms, an aryl group, a hydroxyl group, an amino group or a halogen at any position; and $R_1$, $R_2$ and $R_3$ may be the same or different.

Specifically, aryl phosphines such as triphenyl phosphine, tri(o-, m- or p-tolyl) phosphine and tri(p-methoxyphenyl) phosphine, or alkyl phosphines such as tributyl phosphine, trioctyl phosphine, tris(3-hydroxypropyl) phosphine and tribenzyl phosphine are preferably used. Among these compounds, triphenyl phosphine, tri(p-tolyl) phosphine, tri(p-methoxyphenyl) phosphine, trioctyl phosphine and tris(3-hydroxypropyl) phosphine are used particularly preferably, and triphenyl phosphine, tri(p-tolyl) phosphine and tri(p-methoxyphenyl) phosphine are used most preferably.

Since the complex of aryl phosphines or alkyl phosphines is cationic, a counter anion is necessary. As the counter anions, organic sulfonic ions, organic carboxylic ions, halogen ions, nitric ions and sulfuric ions can be used alone, or a mixture of two or more of them.

Examples of preferred organic sulfonic acid used as the counter anions may include methanesulfonic acid, 2-hydroxyethanesulfonic acid, 2-hydroxypropane-1-sulfonic acid, trichloromethanesulfonic acid, trifluoromethanesulfonic acid, benzenesulfonic acid, toluenesulfonic acid, phenolsulfonic acid, cresolsulfonic acid, anisolesulfonic acid and naphthalenesulfonic acid. Particularly, methanesulfonic acid, toluenesulfonic acid and phenolsulfonic acid are preferred.

As the organic carboxylic acid used as the counter anions, for example, monocarboxylic acids such as formic acid, acetic acid, propionic acid, butanoic acid and octanoic acid; dicarboxylic acids such as oxalic acid, malonic acid and succinic acid; hydroxycarboxylic acids such as lactic acid, glycolic acid, tartaric acid and citric acid; and halogen-substituted carboxylic acids such as monochloroacetic acid, dichloroacetic acid, trichloroacetic acid, trifluoroacetic acid and perfluoropropionic acid are suitably used.

Among these organic carboxylic acids, formic acid, acetic acid, oxalic acid, lactic acid, trichloroacetic acid, trifluoroacetic acid and perfluoropropionic acid are preferred, and acetic acid, lactic acid and trifluoroacetic acid are particularly preferred.

As the azoles, for example, tetrazole, triazole, benzotriazole, imidazole, benzimidazole, pyrazole, indazole, thiazole, benzothiazole, oxazole, benzoxazole, pyrrole, indole and derivatives thereof can be used alone, or a mixture of two or more of them can be used.

Among these compounds, tetrazole, 5-mercapto-1-phenyltetrazole, 1,2,3-triazole, 1,2,4-triazole, 3-mercapto-1,2,4-triazole, benzotriazole, tolyltriazole, carboxybenzotriazole, imidazole, 2-mercaptoimidazole, benzimidazole, 2-octylbenzimidazole, 2-phenylbenzimidazole, 2-mercaptobenzimidazole, 2-methylthiobenzimidazole, pyrazole, indazole, thiazole, benzothiazole, 2-phenylbenzothiazole, 2-mercaptobenzothiazole, 2-methylthiobenzothiazole, isoxazole, anthranil, benzoxazole, 2-phenylbenzoxazole, 2-mercaptobenzoxazole, pyrrole, 4,5,6,7-tetrahydroindole and indole are preferred.

Among these compounds, 5-mercapto-1-phenyltetrazole, 3-mercapto-1,2,4-triazole, benzotriazole, tolyltriazole, carboxybenzotriazole, imidazole, benzimidazole, 2-octylbenzimidazole, 2-mercaptobenzimidazole, benzothiazole, 2-mercaptobenzothiazole, benzoxazole and 2-mercaptobenzoxazole are used particularly preferably.

The ratio of the tin powder in the above composition to the above-mentioned metal salt or complex, i.e., (Weight of tin powder):(Weight of metal salt or complex), is about 99:1 to 50:50, preferably about 97:3 to 60:40. In the present invention, the metal complex is preferred over the metal salt.

In addition to the above-mentioned components, flux component and solvent can be added into the above-mentioned composition. As a flux component, similar ones which are used for tin-lead, tin-silver, and tin-copper solder material are usable. As a solvent, any one is usable which can dissolve other component in a composition and adjust viscosity and concentration.

The above-mentioned solder composition 5 may be applied to the entire surface of the substrate 1, or alternatively, applied with a screen-printing method using a metal mask and a squeegee. The amount of application of the solder composition 5 can be determined properly depending on the size and height of solder bumps 6 to be formed. That is, the amount of application may be determined so as to obtain a predetermined amount of solder alloy to be deposited.

After application, solder alloy is deposited by heating at a predetermined temperature. Since solder alloy to be generated at this time has a high wettability with copper that constitutes the electrode 2, it selectively attaches to the surface of the electrode 2 and forms the solder bump 6. Particularly when using the above-mentioned complex, there is a tendency to improve the selectivity to the surface of the electrode 2. Therefore, after heating, the substrate 1 is allowed to cool, and the remaining alloy component and the like are washed away, thereby preventing solder alloy from remaining anywhere except for the electrode 2.

Although heating temperature is not particularly limited, it is about 180 to 280° C., preferably about 200 to 250° C., taking into consideration the thermal resistance of electronic parts and the like. Heating time may be determined properly depending on the constitution of the above-mentioned composition, and it is usually about 30 seconds to 10 minutes, preferably about 1 to 5 minutes.

Although the deposition processing of solder alloy (application and heating processing) may be performed by dividing the processing into two or more times, according to the present invention there is the advantage of being able to form the solder bumps 6 having a desired height in a single deposition processing. The reason for this is presumed that the presence of the dams 4 around the electrode 2 facilitates deposition of deposited solder alloy onto the electrode 2. As a result, solder bumps 6 of less variation are obtainable in a single deposition processing, and there is also the advantage that the solder bumps 6 are free from any voids.

The solder bumps 6 so obtained are usually 40 to 100 μm in height. In accordance with the method of the present invention, the solder bumps 6 can be arranged at narrow pitches, and it is able to comply with such pitches as narrow as about 80 μm.

The solder deposition method of the present invention is also applicable to bump formation by precoating to the surface of electrodes (conductor patterns) of multi chip modules or various packages, presoldering to a via-on-pad of build-up process substrate, and fine pitch bump formation, as well as solder precoating for mounting TCP (tape carrier package), and high-volume precoating for mounting QFP (quad flat package).

The following examples illustrate the manner in which the present invention can be practiced. It is understood, however, that the examples are for the purpose of illustration and the invention is not to be regarded as limited to any of the specific materials or condition therein.

EXAMPLE 1

<Formation of Dams>

As a substrate, there was used a substrate that had a surface covered with a solder resist film having a thickness of 20 μm, and pads (copper foil electrodes) exposing from an opening part (100 μm in diameter) formed in the solder resist film. The pads were formed on the substrate at pitches of 200 μm.

A film-like resist material (a negative electric photoetching resist, "Zonne EDUV376", available from Kansai Paint Co., Ltd.) was stuck by pressure to the substrate surface, and a mask was then disposed on the substrate surface. The individual pads and their surroundings were exposed and then etched with $Cu_2Cl_2$ aqueous solution. Thus, 100 μm thick resist dams with an opening part having an internal diameter of 100 μm were formed at pitches of 200 μm around the pads.

<Solder Composition>

The following ingredients were kneaded to obtain a solder precipitating composition.

| | |
|---|---|
| Sn/Pb alloy powder (Sn/Pb = 70/30, 10 μm in average particle diameter) | 60% by weight |
| Lead Naphthenate | 25% by weight |
| Flux | 15% by weight |

The used flux was obtained by mixing the following ingredients and then melting while heating at 120° C., following by cooling at room temperature.

| | |
|---|---|
| Rosin resin | 70% by weight |
| Hexyl carbitol (solvent) | 25% by weight |
| Hardened castor oil (thixotropy agent) | 5% by weight |

<Solder Deposition Processing>

A metal mask having an opening part that opens over the entire surface of pad formation locations on the above-mentioned substrate surface having the dams thereon was mounted on the substrate surface. Subsequently, the solder composition obtained above was printed all over the opening of the metal mask from above the dams to a height of 100 μm. After heating at temperatures of 210° C. or higher for two minutes, ultrasonic cleaning in butyl carbitol at 60° C. was performed to remove excess solder alloy, thereby obtaining solder bumps. The dams were then removed by immersing the substrate in a 3% NaOH aqueous solution.

EXAMPLE 2

Solder bumps were formed in the same manner as in Example 1, except that a substrate on which pads were arranged at pitches of 250 μm was used; that dams having a thickness of 50 μm were formed on this substrate, which were arranged at pitches of 250 μm and provided with an opening part having an internal diameter of 140 μm; that a solder composition was printed from above the dams to a height of 150 μm; and that the dams were not removed after forming the solder bumps.

COMPARATIVE EXAMPLE 1

Solder bumps were formed on a substrate in the same manner as in the Example 1, except that no dam was formed.

EXAMPLE 3

Solder bumps were formed in the same manner as in the Example 1, except that a via-on-pad structured substrate having via holes (200 μm in pad pitch) was used as a substrate.

COMPARATIVE EXAMPLE 2

Using the same via-on-pad structured substrate as in Example 3, dams were formed on this substrate in the same manner as in the Example 1. As a solder composition, a conventional solder paste was used which was a mixture of 90% by weight of Sn/Pb alloy powder (Sn/Pb=63/37, 20 μm in particle diameter) and 10% by weight flux of the following ingredients.

| | |
|---|---|
| Rosin resin | 65% by weight |
| Hexyl carbitol (solvent) | 35% by weight |
| Hardened castor oil (thixotropy agent) | 5% by weight |

This solder paste was charged into the dams up to the same thickness as the thickness of the dams (100 μm), and then heated at temperatures of 210° C. or higher for one minute. Thereafter, in the same manner as in Example 1, cleaning and removal of the dams were performed to form solder bumps.

COMPARATIVE EXAMPLE 3

Solder bumps were formed on a substrate in the same manner as in the Example 1, except that no dam was formed on the substrate and solder deposition processing was performed twice. In the deposition processing, a metal mask was used, and a solder composition was printed in a film thickness of 100 μm and then heated at temperatures of 210° C. or higher for one minute. After cleaning, the solder composition was printed again in the same film thickness, and then heated and cleaned under the same conditions.

EXAMPLE 4

Using a via-on-pad structured substrate (200 μm in pad pitch) as a substrate, dams were formed on the substrate in the same manner as in the Example 1. Deposition processing was performed in the same manner as in Example 1, except that a solder composition was prepared by kneading 50% by weight of Sn powder having a particle diameter of 10 μm, 25% by weight of Ag complex of tetrakis(triphenylphosphine)methanesulfonic acid, and 25% by weight of flux; and that heating temperature was 250° C. The dams were then removed to obtain solder bumps.

EXAMPLE 5

Solder bumps were formed on a substrate in the same manner as in the Example 2, except that a via-on-pad structured substrate (250 μm in pad pitch) was used as the substrate; that a solder composition was prepared by kneading 50% by weight of Sn powder having a particle diameter of 10 μm, 25% by weight of Ag complex of tetrakis(triphenylphosphine)methanesulfonic acid, and 25% by weight of flux; and that heating temperature was 250° C.

COMPARATIVE EXAMPLE 4

Using a via-on-pad structured substrate having via holes (200 μm in pad pitch) as a substrate, dams were formed on the substrate in the same manner as in the Example 1. On the other hand, a conventional solder paste was used as a solder composition, which was a mixture of 88% by weight of Sn/Ag alloy powder (Sn/Ag=96.5/3.5, 20 μm in particle diameter) and 12% by weight of the same flux as in Comparative Example 2. This solder paste was charged into the dams up to the same thickness as the thickness of the dams (100 μm) and then heated at temperatures of 250° C. or higher for one minute.

Thereafter, in the same manner as in Example 1, cleaning and removal of the dams were performed to form solder bumps.

<Evaluation Method>

1. Measurement of Height of Solder Bumps

With a measuring microscope ("STM5", available from Olympus Corporation), the individual bump heights from above the solder resist film surface were measured, and a mean value was calculated (n=50).

2. Variations in Height of Solder Bumps

From the measured values of the height of individual bumps, a standard deviation was calculated, which was used as a variation value. A greater numerical value indicates a greater variation.

3. Presence/Absence of Voids

The presence and absence of voids within the bumps was judged from soft X-ray analysis of individual bumps (Microfocus X-ray TV fluoroscope "SMX-16DV", available from Shimadzu Corporation).

These evaluation results are shown in Table 1.

TABLE 1

|  | Height of solder bumps (measured from above solder resist film) (μm) | Variation in height of bumps | Voids within bumps |
|---|---|---|---|
| Example 1 | 63 | 3.9 | None |
| Example 2 | 72 | 3.7 | None |
| Comp. Ex. 1 | 64 | 6.8 | None |
| Example 3 | 55 | 3.8 | None |
| Comp. Ex. 2 | 60 | 4.1 | Present |
| Comp. Ex. 3 | 58 | 3.9 | None |
| Example 4 | 50 | 3.6 | None |
| Example 5 | 65 | 3.7 | None |
| Comp. Ex. 4 | 62 | 4.2 | Very large number |

The followings are apparent from Table 1. Comparative Example 1 has a large variation in the height of bumps and poor precision, because the solder bumps were formed without dams. Comparative Example 2 may cause voids even if dams were provided, because it employed the usual solder paste. Comparative Example 3 has good results in all of the evaluations but its efficiency is poor, because the solder deposition processing was performed twice. In Comparative Example 4 using the lead-free solder paste, voids occurred as in Comparative Example 2.

On the contrary, in Example 1 through Example 5, the solder bumps having a sufficient height are formed at high precision in a single processing by forming the dams around the pads on the substrate and using the solder precipitating composition.

What is claimed is:

1. A solder deposition method comprising the steps of:
   forming a dam around an electrode on a substrate;
   applying a solder precipitating composition to said substrate; and
   heating the resulting substrate so as to form a solder on the surface of said electrode,
   wherein said solder precipitating composition comprises a tin powder and a silver or copper complex of at least one member selected from the group consisting of aryl phosphines, alkyl phosphines and azoles.

2. The solder deposition method according to claim 1, wherein said step of forming a dam includes the steps of:
   forming a resin film on the surface of said substrate; and
   providing an opening part in said resin film so that a dam is formed around an electrode on a substrate.

3. The solder deposition method according to claim 1, wherein said dam is not removed after depositing solder.

4. The solder deposition method according to claim 1, wherein said substrate is a via-on-pad structured substrate.

5. The solder deposition method according to claim 1, wherein the phosphine is represented by formula (1)

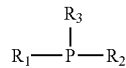

wherein $R_1$, $R_2$ and $R_3$ each represents a substituted or non-substituted aryl group, or a substituted or non-substituted chain or cyclic alkyl group having 1 to 8 carbon atoms; hydrogen of the aryl group may be substituted with an alkyl having 1 to 8 carbon atoms, an alkoxy group having 1 to 8 carbon atoms, a hydroxyl group, an amino group or a halogen atom at any position; hydrogen of the alkyl group may be substituted with an alkoxy group having 1 to 8 carbon atoms, an aryl group, a hydroxyl group, an amino group or a halogen at any position; and $R_1$, $R_2$ and $R_3$ may be the same or different.

6. The solder deposition method according to claim 1, wherein the aryl phosphines is triphenyl phosphine, tri(o-, m- or p-tolyl) phosphine or tri(p-methoxyphenyl) phosphine.

7. The solder deposition method according to claim 1, wherein the alkyl phosphines is tributyl phosphine, trioctyl phosphine, tris(3-hydroxypropyl) phosphine, or tribenzyl phosphine.

8. The solder deposition method according to claim 1, wherein the complex of aryl phosphines or alkyl phosphines is cationic and the counter anion is an organic sulfonic ion, organic carboxylic ion, halogen ion, nitric ion or sulfuric ion, or mixtures thereof.

9. The solder deposition method according to claim 8, wherein the organic sulfonic acid is a methanesulfonic acid, 2-hydroxyethanesulfonic acid, 2-hydroxypropane-1-sulfonic acid, trichloromethanesulfonic acid, trifluoromethanesulfonic acid, benzenesulfonic acid, toluenesulfonic acid, phenolsulfonic acid, cresolsulfonic acid, anisolesulfonic acid or naphthalenesulfonic acid.

10. The solder deposition method according to claim 8, wherein the organic carboxylic acid is a monocarboxylic acid, dicarboxylic acid, hydroxycarboxylic acid, or halogen-substituted carboxylic acid.

11. The solder deposition method according to claim 10, wherein the organic carboxylic acid is formic acid, acetic acid, propionic acid, butanoic acid, octanoic acid, oxalic acid, malonic acid, succinic acid, lactic acid, glycolic acid, tartaric acid, citric acid, monochloroacetic acid, dichloroacetic acid, trichloroacetic acid, trifluoroacetic acid or perfluoropropionic acid.

12. The solder deposition method according to claim 1, wherein the azoles is tetrazole, triazole, benzotriazole, imidazole, benzimidazole, pyrazole, indazole, thiazole, benzothiazole, oxazole, benzoxazole, pyrrole, indole and derivatives thereof, or a mixture of two or more.

13. The solder deposition method according to claim 12, wherein the azole is tetrazole, 5-mercapto-1-phenyltetrazole, 1,2,3-triazole, 1,2,4-triazole, 3-mercapto-1,2,4-triazole, benzotriazole, tolyltriazole, carboxybenzotriazole, imidazole, 2-mercaptoimidazole, benzimidazole, 2-octylbenzimidazole, 2-phenylbenzimidazole, 2-mercaptobenzimidazole, 2-methylthiobenzimidazole, pyrazole, indazole, thiazole, benzothiazole, 2-phenylbenzothiazole, 2-mercaptobenzothiazole, 2-methylthiobenzothiazole, isoxazole, anthranil, benzoxazole, 2-phenylbenzoxazole, 2-mercaptobenzoxazole, pyrrole, 4,5,6,7-tetrahydroindole or indole.

14. A solder deposition method comprising the steps of:
forming a dam around an electrode on a substrate;
applying a solder precipitating composition comprising a tin powder and a silver or copper complex of at least one member selected from the group consisting of aryl phosphines, alkyl phosphines and azoles to said substrate; and
heating the resulting substrate, whereby the tin powder reacts with the complex so as to precipitate a solder on the surface of said electrode.

15. A solder deposition method comprising the steps of:
forming a dam around an electrode on a substrate;
kneading a composition comprising tin powder and a silver or copper complex of at least one member selected from the group consisting of aryl phosphines, alkyl phosphines and azoles to form a solder precipitating composition;
applying said solder precipitating composition to said substrate; and
heating the resulting substrate so as to deposit a solder on the surface of said electrode.

* * * * *